United States Patent
Takenaka

(10) Patent No.: US 7,523,029 B2
(45) Date of Patent: Apr. 21, 2009

(54) LOGIC VERIFICATION AND LOGIC CONE EXTRACTION TECHNIQUE

(75) Inventor: Takashi Takenaka, Tokyo (JP)

(73) Assignee: Nec Corporation, Tokyo (JP)

( * ) Notice: Subject to any disclaimer, the term of this patent is extended or adjusted under 35 U.S.C. 154(b) by 583 days.

(21) Appl. No.: 10/612,193

(22) Filed: Jul. 3, 2003

(65) Prior Publication Data

US 2004/0025127 A1 Feb. 5, 2004

(30) Foreign Application Priority Data

Jul. 4, 2002 (JP) ............................. 2002-195514

(51) Int. Cl.
*G06F 17/50* (2006.01)
(52) U.S. Cl. ........................................... 703/14; 716/5
(58) Field of Classification Search ................... 703/14; 716/5
See application file for complete search history.

(56) References Cited

U.S. PATENT DOCUMENTS

| | | | |
|---|---|---|---|
| 6,611,947 B1 * | 8/2003 | Higgins et al. ................. | 716/5 |
| 6,745,160 B1 | 6/2004 | Ashar et al. | |
| 7,107,190 B1 | 9/2006 | Tsuchiya et al. | |

2001/0016935 A1 8/2001 Furusawa

FOREIGN PATENT DOCUMENTS

| JP | 8-022485 | 1/1996 |
|---|---|---|
| JP | 2001-14371 A | 1/2001 |
| JP | 2001-142937 A | 5/2001 |
| JP | 2001-222565 A | 8/2001 |

OTHER PUBLICATIONS

"On the Formal Verification of ATM Switches", Jianping Lu 1999.*

(Continued)

*Primary Examiner*—Kamini S Shah
*Assistant Examiner*—Saif A Alhija
(74) *Attorney, Agent, or Firm*—Foley & Lardner LLP

(57) ABSTRACT

Logic verification is performed based on correspondence information and compile information. The correspondence information specifies information on pairs of fragments of descriptions to be compared for equivalence in a behavioral level description written in a programming language and an RT level description obtained through behavioral synthesis and information on pairs of signals to be compared for each of the description pairs. The compile information includes mapping information between the behavioral level description and an object code. A logic cone extraction section extracts first logic cones from the object code through symbolic simulation by referencing the correspondence information and the compile information. The logic cone extraction section extracts second logic cones from the RT level description. A logic cone comparison section verifies equivalence between the first and second logic cones.

6 Claims, 15 Drawing Sheets

OTHER PUBLICATIONS

"As good as gold", Blackett, IEEE 1996.*

"Applied Boolean Equivalence Verification and RTL Static Sign-Off", Harry Foster. IEEE 2001.*

P. Ashar et al., "Verification of Scheduling in the Presence of Loops Using Uninterpreted Symbolic Simulation," International Conference on Computer Design, (1999), pp. 458-466, C&C Research Laboratories, Princeton, N. J.

E. M. Clarke, et al., "Model Checking," (1999), pp. 61-74, The MIT Press, Cambrige, MA.

N. Mansouri et al., "Automated Correctness Condition Generation for Formal Verification of Synthesized RTL Designs," (2000), Formal Methods in System Design, pp. 59-91, Kluwer Academic Publishers, The Netherlands.

S. Malik et al., "Logic Verification Using Binary Decision Diagrams in a Logic Synthesis Environment," IEEE International Conference on Computer-Aided Design, (1988), pp. 6-9.

K. Hamaguchi et al., "Symbolic Checking of Signal-Transition Consistency for Verifying High-Level Designs." Formal Methods in Computer-Aided Design, LNCS1954, Nov. 2000, pp. 455-469.

* cited by examiner

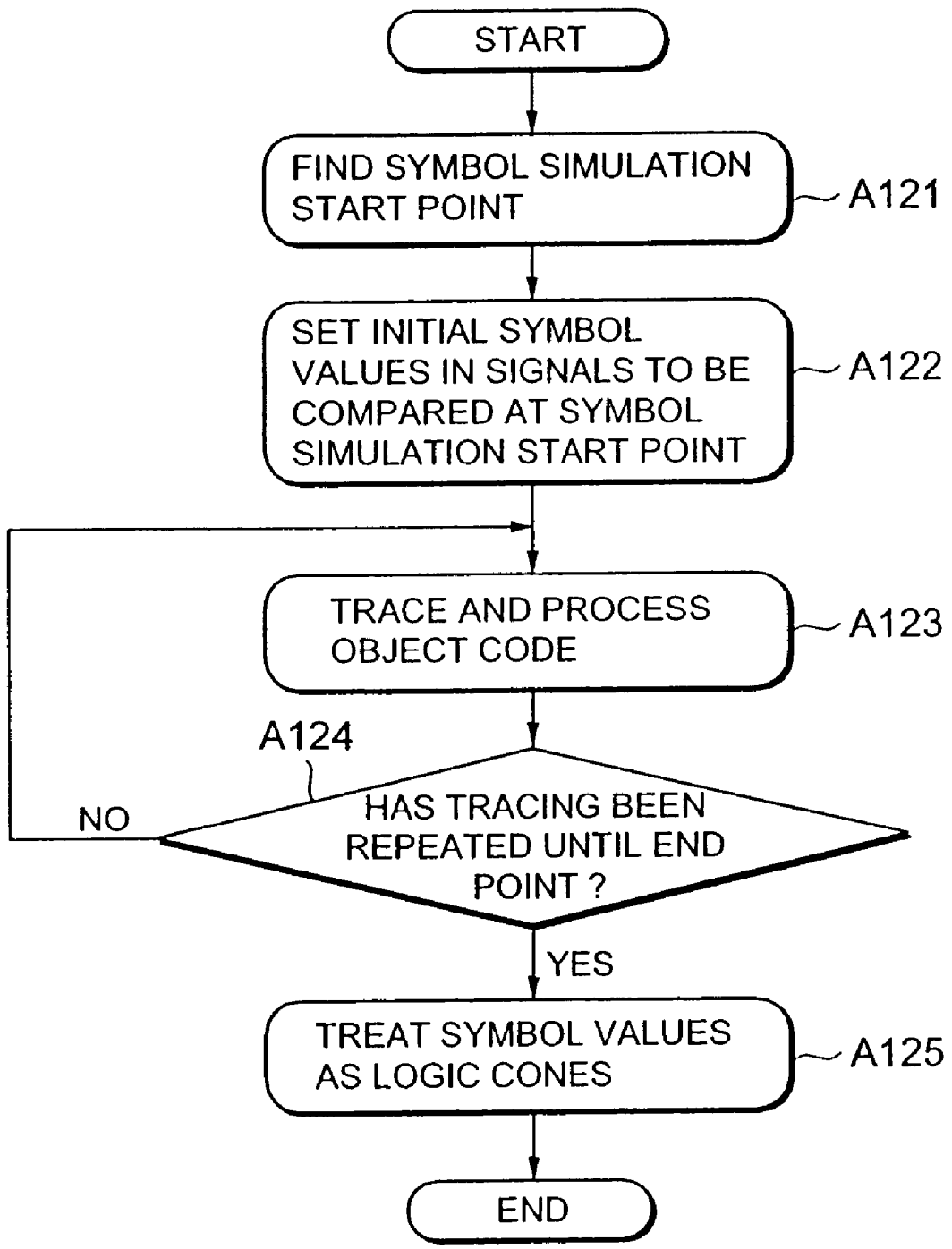

FIG.9

```
int a, b, c ;                        ……(1)
int in0, out0 ;                      ……(2)
#ifdef c                             ……(3)
main ( ) {                           ……(4)
    while (1) {                      ……(5)
        scanf ("%d", &in0) ;         ……(6)
        addition ( ) ;               ……(7)
        printf ("%d\n", out0) ;      ……(8)
}                                    ……(9)
#endif                               ……(10)

/* to behavioral Synthesis */        ……(11)
void addition ( )                    ……(12)
{                                    ……(13)
    b = a + b ;                      ……(14)
    a = in0 ;                        ……(15)
    out0 = b ;                       ……(16)
    return ;                         ……(17)
}                                    ……(18)
```

FIG.10

```
module addition (in0, out0, CLOCK) ;   ……(1)
input [31:0] in0 ;                     ……(2)
output [31:0] out0 ;                   ……(3)
input CLOCK                            ……(4)
reg [31:0] RG01 ;                      ……(5)
reg [31:0] RG02 ;                      ……(6)

assign out0 = RG02 ;                   ……(7)

always @ ( posedge CLOCK)              ……(8)
begin                                  ……(9)
    RG01 <= in0 ;                      ……(10)
    RG02 <= RG01 + RG02 ;              ……(11)
end                                    ……(12)
endmodule                              ……(13)
```

| | |
|---|---|
| addition : | ......(1) |
| movl a, %eax | ......(2) |
| addl %eax, b | ......(3) |
| movl in0, %eax | ......(4) |
| movl %eax, a | ......(5) |
| movl b, %eax | ......(6) |
| movl %eax, out0 | ......(7) |

FIG.12

EXAMPLE OF CORRESPONDENCE INFORMATION (PARTIAL) 13

| SIGNALS IN C DESCRIPTION | SIGNALS IN HDL DESCRIPTION |
|---|---|
| in0 | in0 |
| out0 | out0 |
| a | RG01 |
| b | RG02 |

FIG.13

EXAMPLE OF COMPILE INFORMATION (PARTIAL)

| SIGNALS IN C-LANGUAGE DESCRIPTION | STORAGE AREA IN OBJECT CODE |
|---|---|
| in0 | in0 |
| out0 | out0 |
| a | a |
| b | b |

MEMORY SPACE

FIG.16

EXAMPLES OF LOGIC CONES IN PROGRAM DESCRIPTION

| VARIABLE | LOGIC CONE |
| --- | --- |
| a | in0' |
| b | a'+b' |
| in0 | in0' |
| out0 | a'+b' |

FIG.17

EXAMPLES OF LOGIC CONES IN HDL DESCRIPTION

| VARIABLE | LOGIC CONE |
| --- | --- |
| RG01 | in0' |
| RG02 | RG01'+RG02' |
| in0 | in0' |
| out0 | RG01'+RG02' |

FIG.18

CORRESPONDENCE BETWEEN VARIABLES
IN OBJECT CODE AND SIGNALS IN HDL

| VARIABLE IN OBJECT CODE | SIGNAL IN HDL |
| --- | --- |
| a | RG01 |
| b | RG02 |
| in0 | in0 |
| out0 | out0 |

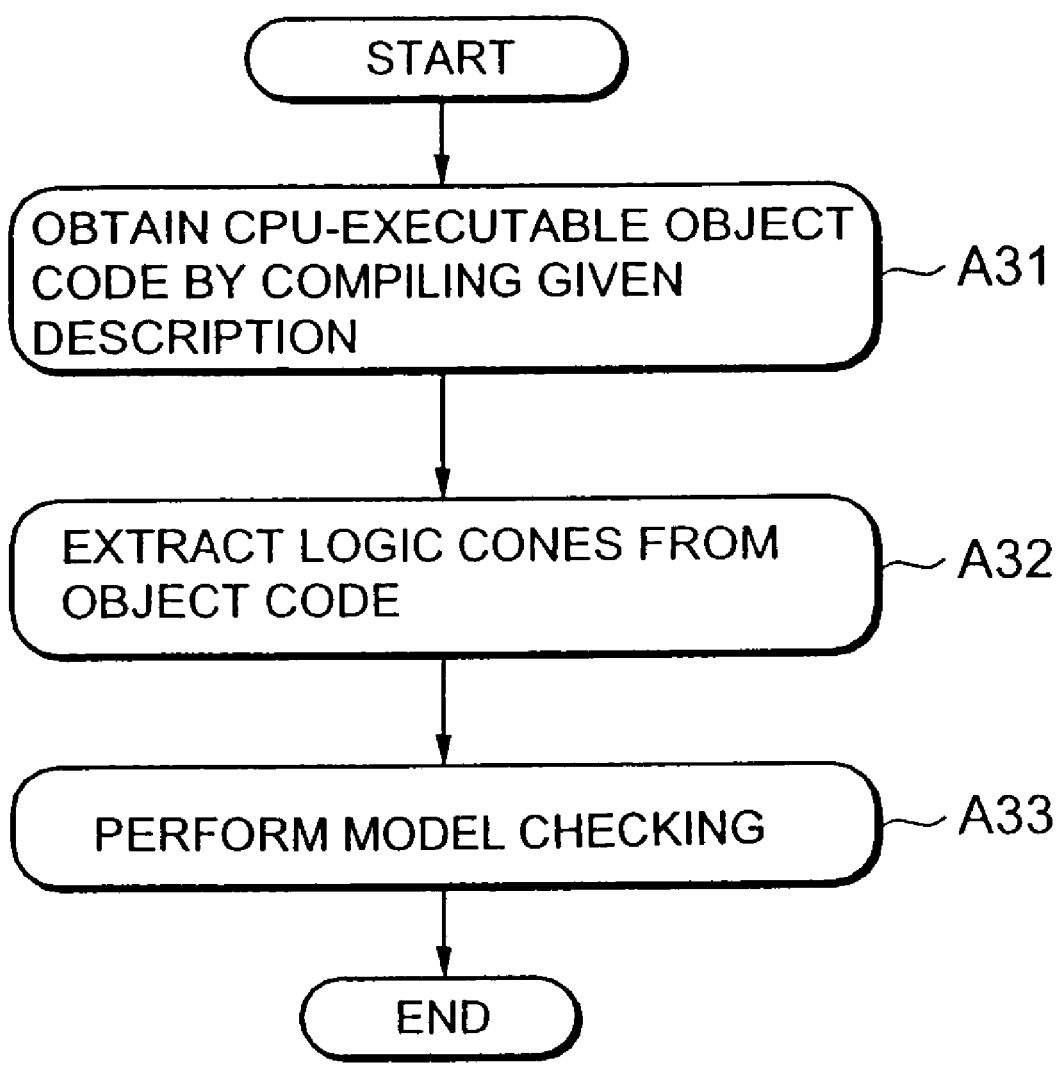

LOGIC VERIFICATION AND LOGIC CONE EXTRACTION TECHNIQUE

BACKGROUND OF THE INVENTION

1. Field of the Invention

The present invention relates generally to logic verification techniques at the stage of designing logic circuits, and more particularly to a logic verification technique intended for logic circuits described in a CPU-executable programming language.

2. Description of the Related Art

LSI design automation/support techniques, developed to automate or support design tasks, are generally employed for designing LSIS or VLSIs. One typical process of VLSI designing processes which employ the LSI design automation/support technology is a top-down design process using various EDA (electronic design automation) tools. Top-down design of this type can be generally divided into system design, functional design, logic design and layout design from upstream to downstream steps. A description of the top-down design will be given below with reference to FIG. 1.

Preparation of system specification begins with description of LSI behaviors by treating the whole LSI as a system. The description is called a behavioral level description 12. The behavioral level description 12 is prepared, for example, in a natural language, HDL (hardware description language) such as VHDL or Verilog HDL or programming language such as C, C++ or Java. The behavioral level description 12 may also be prepared in other programming language such as SystemC or SpecC which incorporates additional features convenient for representing circuits in C or C++.

The behavioral level description 12 is next converted into an RT level (register transfer level) description 14 in behavioral synthesis phase. The RT level description 14 is normally written in HDL or a programming language. Heretofore, it has often been customary to manually perform the behavioral synthesis phase to generate an RTL description using an HDL (hardware description language).

Then, the RT level description 14 is automatically converted into a gate level description (gate level logic circuit: net list) 1D in logic synthesis phase. Layout design is conducted based on the net list thus generated followed by chip design.

Design verification, aimed at validating the design performed in the steps, is also important in LSI design. Design verification is comprised, for example, of equivalence verification which verifies whether the conversion in each synthesis phase is correct and specification verification which verifies whether each description correctly represents the LSI to be designed.

Simulation or formal verification has conventionally been employed for equivalence verification.

Equivalence verification by simulation performs simulation by giving the same test patterns to two descriptions to be compared and examines whether the result equivalent to the desired one. Simulation is performed using a dedicated simulator when the descriptions are represented in HDL as with the RT level description 14. On the other hand, when the descriptions are represented in a programming language as with the behavioral level description 12, simulation is performed by converting the descriptions into a CPU-executable format (called object codes) with a compiler and then directly executing the obtained object codes 15 with the CPU.

Formal equivalence verification uses a mathematical method to verify whether two combinational circuit logics are equivalent. FIG. 2 illustrates a block diagram showing the common configuration of a formal equivalence verification apparatus designed to verify equivalence between the RT level description 14 and the gate level description 1D.

Referring to FIG. 2, the RT level description is represented by reference numeral 14 and the gate level description by reference symbol 1D. Correspondence information is indicated by reference numeral 13 which describes a correspondence relation between signals to be compared at two levels. The signals to be compared are primary inputs, primary outputs, registers and other internal terminals specified by the designer. The signals are referred as the comparison signals. Logic cone extraction sections are represented by reference numeral 23, which extract logic cones respectively from the RT level description and the gate level description. A logic cone refers to a combinational circuit required to determine signal logic, which is represented by a Boolean expression. Extraction of logic cones is made by using a method such as that shown in Document 1: Malik, S. et al, "Logic Verification Using Binary Decision Diagrams in a Logic Synthesis Environment", Proceedings of IEEE International Conference on Computer-Aided Design, pp. 6-9, 1988 More specifically, a logic cone can be obtained by tracing the combinational circuit from a comparison signals to its input. Extracted logic cones are indicated respectively by reference symbols 18 and 1E. Logic cone comparison section are represented by reference numeral 24, which examine logical equivalence of Boolean expressions of the logic cones each corresponding comparison signals. The logic cone extraction section 24 determines that the RT level description 14 and the gate level description 1D are logically equivalent when the logic cones of all the corresponding comparison signals are logically equal, and produces the comparison result to the output device 3.

A formal equivalence verification apparatus for verifying equivalence between the RT level description 14 and the gate level description 1D, similar to FIG. 2, is also disclosed in Japanese Patent Application Unexamined Publication No. 8-22485.

Specification verification is also provided with a known technique, namely, property verification by using simulation or formal method, as with equivalence verification. Specification verification by simulation examines whether the circuit has the desired functionality by giving test patterns to the descriptions to be compared during simulation and analyzing the simulation result. Property verification by formal method statically and mathematically checks whether a given description meets desired properties. Formal property verification is referenced in Document 2: Edmund M. Clarke, et al. "Model Checking", pp 61-74, The MIT Press, 1999. FIG. 3 illustrates a block diagram of configuration of a formal property verification apparatus designed to verify whether the ordinary RT level description 14 meets given properties.

Referring to FIG. 3, the RT level description is represented by reference numeral 14 while the properties to be met by the circuit are indicated by reference symbol 1C. The properties 1C include "no deadlock by the circuit" and "response returned within fixed cycles upon receipt of request signal". The logic cone extraction section 23 extracts logic cones 18 from the RT level description 14. Model checking section 25 enumerates a set of possible signal value combinations (called states). When the set of all possible states of the circuit is enumerated, the model checking section 25 checks whether the set meets the given properties.

Property verification by formal method does not need test data unlike simulation and is capable of completely verifying whether the given properties are met.

With growing scale of integration in resent years, LSIs to be comprised of several millions of gates, and faster verification is becoming critical in specification verification which verifies whether designed circuits have the intended functionality.

The common technique for specification verification is by simulation; however, simulation of the RT level description 14 is becoming more time-consuming as a result of larger scale of integration in circuits available today. In contrast, specification verification at behavioral level tends to be very abstract and fast. Additionally, simulation can be performed using a rich collection of libraries available in the programming language used. For this reason, it is common to represent the behavioral level description 12 in a programming language and convert it into the CPU-executable object code 15 by a compiler and directly execute the object code 15 by the CPU for fast simulation, as shown in FIG. 1. Further, the behavioral level description 12 represented in a programming language is automatically converted into the RT level description 14 by behavioral synthesis phase.

Tools used for such synthesis are in fact commonly comprised of software. However, such tools are not necessarily bug-tree, and therefore verification is needed in each synthesis phase to verify whether synthesis has been properly performed.

The conventionally most popular verification in behavioral synthesis phase is simulation using test patterns; however, this simulation presented the following problems:

Simulation using test patterns naturally requires generation of test patterns, thus requiring time and costs for such a task. Moreover, the nature of synthesis which can be verified by simulation depends on test patterns, thus making it impossible to verify errors not considered in the test patterns. Consequently, there was a possibility that the conventional equivalence verification by simulation could not yield a satisfactory result. Further, repetition of simulation at two levels, namely, behavioral level and RT level, runs counter to the object of introducing behavioral synthesis which is to ensure faster verification.

Other techniques under study for verification of the RT level description 14 against the behavioral level description 12 include formal verification of equivalence between the RT level description 14 and the behavioral level description 12.

An example of behavioral synthesis verification apparatus is described in Document 3: "Formal Methods in System Design, No. 16, pp. 59-91, 2000."

The behavioral synthesis verification apparatus described in the Document 3 outputs 1) formal specification description, 2) correctness lemmas and 3) verification scripts for a theorem proving system called PVS, from a behavioral description, the RT level description and the correspondence relation which is a by product of behavioral synthesis. A correctness lemma refers to a logic formula representing such conditions that, changes in values of pairs of comparison signals are the equivalent for all execution paths (state series) of behavioral description and RT level description respectively. In the Document 3, the execution paths are limited to those which does not include branching/confluence structure. The correspondence relation mentions which pair of comparison signals are corresponding between the behavioral description and the RT level descriptions. The correspondence relation also mentions which pair of execution paths are corresponding between the two descriptions. According to generated verification scripts, the PVS uses a symbolic term rewriting method along with the execution paths to generate functions, each of which represents a change in comparison signal along with the given execution path. Then, the PVS examines whether the functions representing changes in signal values are equivalent for each pair of corresponding comparison signals and for each pair of corresponding execution paths. The PVS verifies equivalence between the behavioral description and the RT level description by showing that the generated functions are equivalent for all pairs of corresponding comparison signals and for all pairs of corresponding execution paths.

Another example of behavioral synthesis verification apparatus is described in Document 4: "International Conference on Computer Design, pp. 456-466, 1999."

The behavioral synthesis verification apparatus in the Document 4 is basically identical to the apparatus described in the Document 3. The apparatus described in the Document 4 does not restrict the execution paths to be basic block. The loops of the repetition structure (loops structure) of original behavioral description are unrolled until correspondence relations between the execution paths of the behavioral description and the ones of RT level description are found. The technique called symbolic simulation is employed rather than symbolic term rewriting to generate functions representing changes in signal values.

The prior art as described above has exclusively used the above method to verify equivalence between the behavioral level description 12 and the RT level description 14, and not much emphasis has been placed on verification of equivalence between the object code 15 compiled from the behavioral level description 12 and the RT level description 14.

For this reason, there has been a possibility that equivalence cannot be guaranteed between a result of execution of the object code 15 compiled from the behavioral level description 12 by the CPU and the execution result of operations of the actual circuit designed from the behavioral level description 12. Since meanings of languages can be changed by libraries linked during compiling in many programming languages, there is not necessarily a guarantee that the behavioral level description 12 and the object code 15 compiled from the behavioral level description 12 are equivalent. Additionally, since compilers, designed to convert the behavioral level description 12 into a CPU-executable format, are comprised of software, they are not necessarily free of bugs, occasionally causing the behavioral level description 12 to be unequivalent to the object code 15. If the behavioral level description 12 and the object code 15 are not equivalent, the RT level description 14, derived from the behavioral level description 12, is not equivalent to the object code 5, thus making it impossible to determine that the operations of the RT level description 14 are correct even if the operations of the object code 15 are found to be correct as a result of execution of this code. This can result in the designer erroneously proceeding with the next phase, namely, logic synthesis phase despite the fact that operational check has not been correctly performed in behavioral synthesis phase.

This is the reason why a logic verification system is desired which can guarantee equivalence between an execution result of the object code 15 compiled from the behavioral level description 12 and an execution result of operations of the circuit obtained from behavioral synthesis.

There are also demands for formal property verification on the behavioral level description 12. In this case, since formal property verification and simulation are complimentary to each other, it is preferable that operations executed by the CPU, that is, the object code 15 can be verified.

To implement these logic verification capabilities using logic cones, a technique is required which can extract logic cones from the CPU-executable object code since conventional logic cone extraction techniques, designed to extract logic cones from HDL or gate level descriptions, cannot be used.

SUMMARY OF THE INVENTION

It is therefore an object of the present invention to provide a logic verification system and method which can guarantee equivalence between an execution result of an behavioral level description by the CPU and an execution result of operations of a circuit obtained from behavioral synthesis by verifying equivalence between an object code compiled from the behavioral level description and an RT level description derived from the behavioral level description.

It is another object of the present invention to provide a formal property verification system and method applicable to operations obtained from execution of a behavioral level description by the CPU.

It is yet another object of the present invention to provide a logic cone extraction apparatus and method for extract logic cones from an object code.

According to the present invention, a first logic cone extraction section for extracting first logic cones from a machine-executable object code compiled from a behavioral level description written in a programming language is basic to a logic verification system. In the case where the present invention is applied to the logic verification of an RT level description against its behavioral description, the logic verification system further includes a second logic cone extraction section for extracting second logic cones from an RT level description; and a logic cone comparison section for comparing the first logic cones and the second logic cones to verify equivalence between the first and second logic cones. Here, the first logic cone extraction section may include a symbolic simulation section.

More specifically, a logic verification system according to a first aspect of the present invention, includes: a storage section for storing an object code compiled from an behavioral level description written in a programming language, an RT level description generated from the behavioral level description, correspondence information which specifies information on pairs of fragments of descriptions to be compared and which specifies information on pairs of signals to be compared for each description pair, and compile information including mapping information between the behavioral level description and the object code; a first logic cone extraction section for extracting first logic cones each for the behavioral signals and each for fragments of behavioral description to be compared by searching a code portion and the variables of the object code corresponding to each fragments of behavioral descriptions and each signals to be compared which are specified by the correspondence information by referencing the compile information, setting initial symbol values in the variables, performing symbolic simulation from the start to end points of the code portion to produce symbol values when the symbolic simulation ends, and using the symbol values as the first logic cones of the variables; a second logic cone extraction section for extracting second logic cones each for the RT level signals for each fragments of RT level description to be compared which are specified by the correspondence information; and a logic cone comparison section for comparing the first logic cones and the second logic cones for each signals for each of fragments of the descriptions to be compared which are specified by the correspondence information.

A logic verification system according to a second aspect of the present invention, includes: a first logic cone extraction section for extracting first logic cones from a machine-executable object code compiled from an behavioral level description written in a programming language; a storage section for storing properties to be met by the behavioral level description; and a model checking section for checking whether the object code meets the properties based on the first logic cones.

A logic cone extraction apparatus according to the present invention, includes: an input section for inputting an object code compiled from a program description, correspondence information which specifies logic cone extraction areas within the program description and signals to be extracted for each of the logic cone extraction areas, and compile information including mapping information between the program description and the object code; a symbolic simulation section which, by referencing the compile information, searching a code portion and variables of the object code corresponding to logic cone extraction areas and signals to be extracted which are specified by the correspondence information, sets initial symbol values in the variables, and performs symbolic simulation from the start to end points of the code portion; and an output section for outputting symbol values which are obtained when the symbolic simulation ends, as logic cones of the variables.

According to the present invention, a first logic cone extraction step of extracting first logic cones from a machine-executable object code compiled from a behavioral level description written in a programming language is basic to a logic verification method. In the case where the present invention is applied to the logic verification of an RT level description against its behavioral description, the logic verification method further includes the steps of: extracting second logic cones from an RT level description; and comparing the first logic cones and the second logic cones to verify equivalence between the first and second logic cones. Here, the first logic cones maybe extracted by performing symbolic simulation.

More specifically a logic verification method according to a first aspect of the present invention, includes the steps of: inputting an object code compiled from an behavioral level description written in a programming language, an RT level description generated from the behavioral level description, correspondence information which specifies information on pairs of fragments of descriptions to be compared and which specifies information on pairs of signals to be compared for each description pair, and compile information including mapping information between the behavioral level description and the object code; searching a code portion and the variables of the object code corresponding to each fragments of behavioral descriptions and each signals to be compared which are specified by the correspondence information by referencing the compile information; setting initial symbol values in the variables; performing symbolic simulation from the start to end points of the code portion; determining first logic cones of the variables as symbol values when the symbolic simulation ends; extracting second logic cones each for the signals for each fragments of RT level description to be compared which are specified by the correspondence information; and comparing the first logic cones and the second logic cones for each signals for each of fragments of the descriptions to be compared which are specified by the correspondence information.

A logic verification method according to another aspect of the present invention, includes the steps of: extracting first logic cones from a machine-executable object code compiled from an behavioral level description written in a programming language; inputting properties to be met by the behavioral level description; and checking whether the object code meets the properties based on the first logic cones.

A logic cone extraction method according to a second aspect of the present invention, includes the steps of: inputting an object code compiled from a program description, correspondence information which specifies logic cone extraction areas within the program description and signals to be extracted for each of the logic cone extraction areas, and compile information including mapping information between the program description and the object code; searching a code portion and variables of the object code corresponding to logic cone extraction areas and signals to be extracted which are specified by the correspondence information by referencing the compile information; setting initial symbol values in the determined variables; performing symbolic simulation from the start to end points of the determined code portion; and outputting symbol values which are obtained when the variable symbolic simulation ends, as logic cones of the variables.

The logic verification system and method according to the first aspect of the present invention are capable of verifying equivalence between an object code compiled from a behavioral level description written in a program description language and an RT level description by extracting logic cones from the object code directly executed by the CPU. This allows logic verification which can guarantee equivalence between an execution result of the behavioral level description by the CPU and an execution result of operations of the circuit obtained from behavioral synthesis.

The logic verification system and method according to the second aspect of the present invention are capable of formal property verification applicable to operations executed by the CPU by extracting logic cones required for logic equivalence verification from an object code directly executed by the CPU.

The logic cone extraction apparatus and method according to the present invention are capable of automatic extraction of logic cones from an object code compiled from a program description based on the correspondence information which specifies the logic cone extraction areas in the program description and the signals to be extracted and compile information which includes mapping information between the program description and the object code.

BRIEF DESCRIPTION OF THE DRAWINGS

FIG. 8 is a flowchart showing operations of the first embodiment;

FIG. 9 illustrates a specific example of operations of the first embodiment;

FIG. 10 illustrates a specific example of operations of the first embodiment;

FIG. 11 illustrates a specific example of operations of the first embodiment;

FIG. 12 illustrates a specific example of operations of the first embodiment;

FIG. 13 illustrates a specific example of operations of the first embodiment;

FIG. 16 illustrates a specific example of operations of the first embodiment;

FIG. 17 illustrates a specific example of operations of the first embodiment;

FIG. 18 illustrates a specific example of operations of the first embodiment;

FIG. 21 is a flowchart showing operations of the third embodiment.

DESCRIPTION OF THE PREFERRED EMBODIMENTS

Embodiments of the present invention will now be described with reference to the accompanying drawings.

First Embodiment

Figure 1:
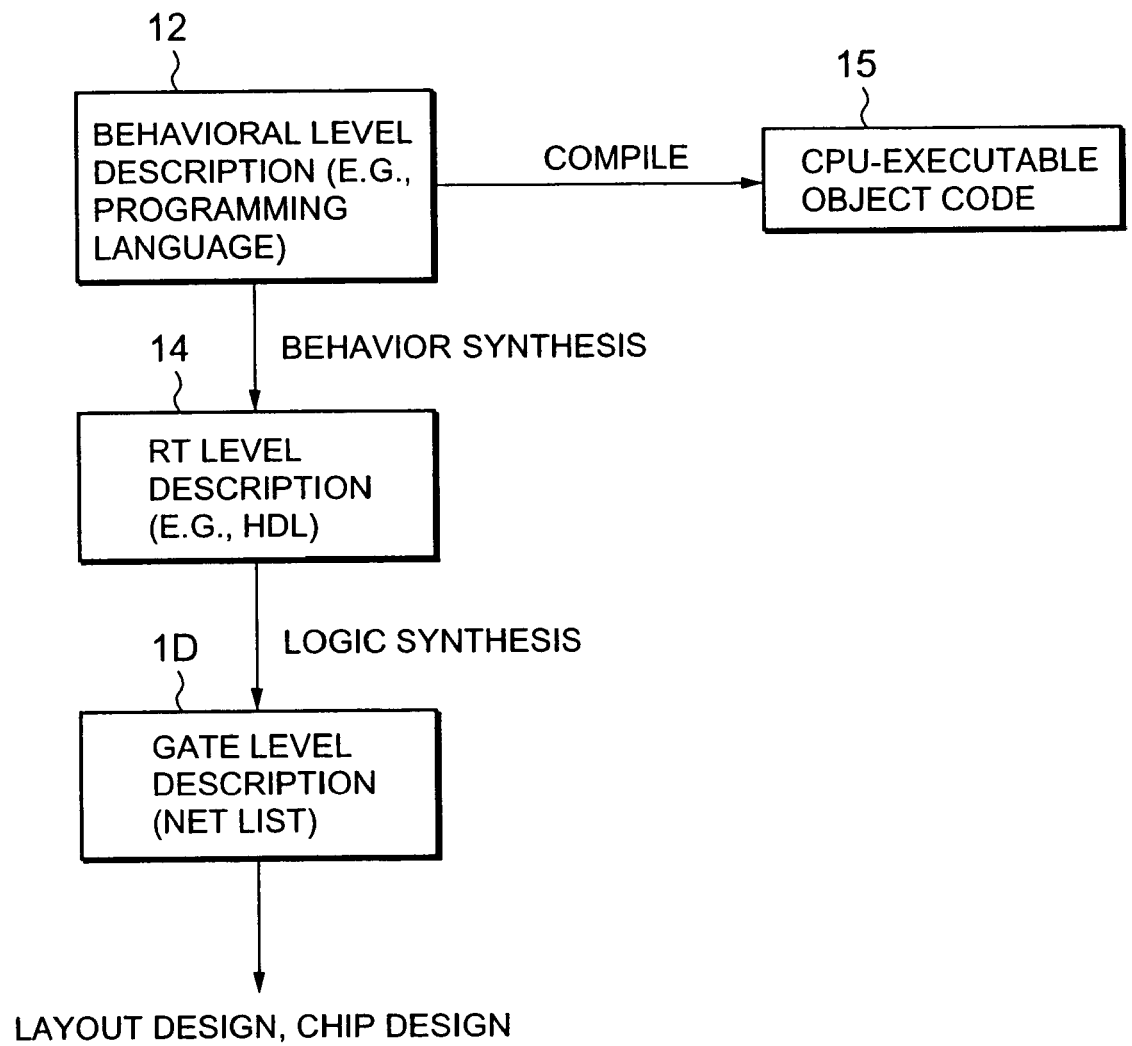
FIG. 1 schematically shows a top-down design flow in conventional fashion.
Figure 2:
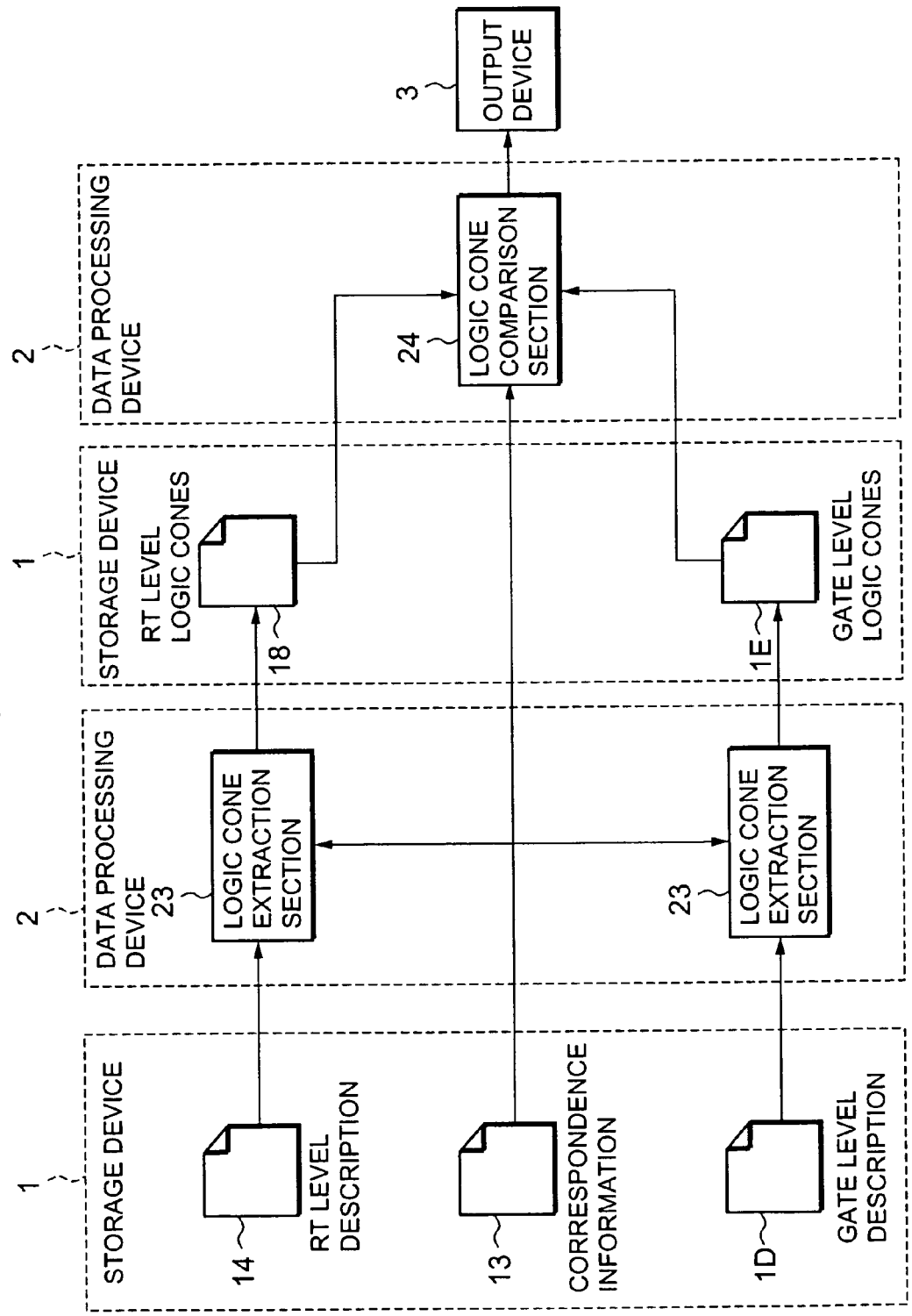
FIG. 2 is a block diagram showing a conventional formal equivalence verification apparatus.
Figure 3:
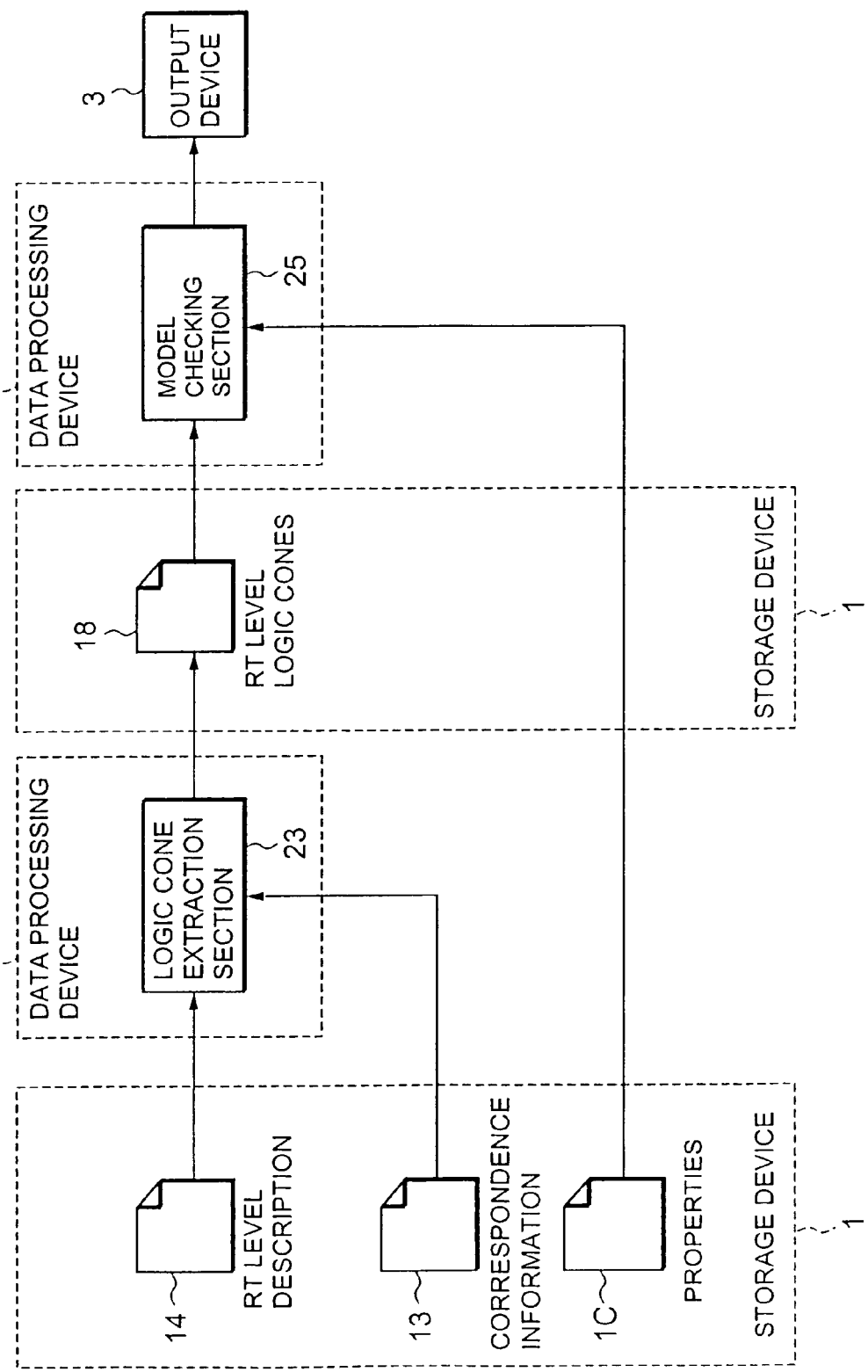
FIG. 3 is a block diagram showing a conventional formal property verification apparatus.
Figure 4:
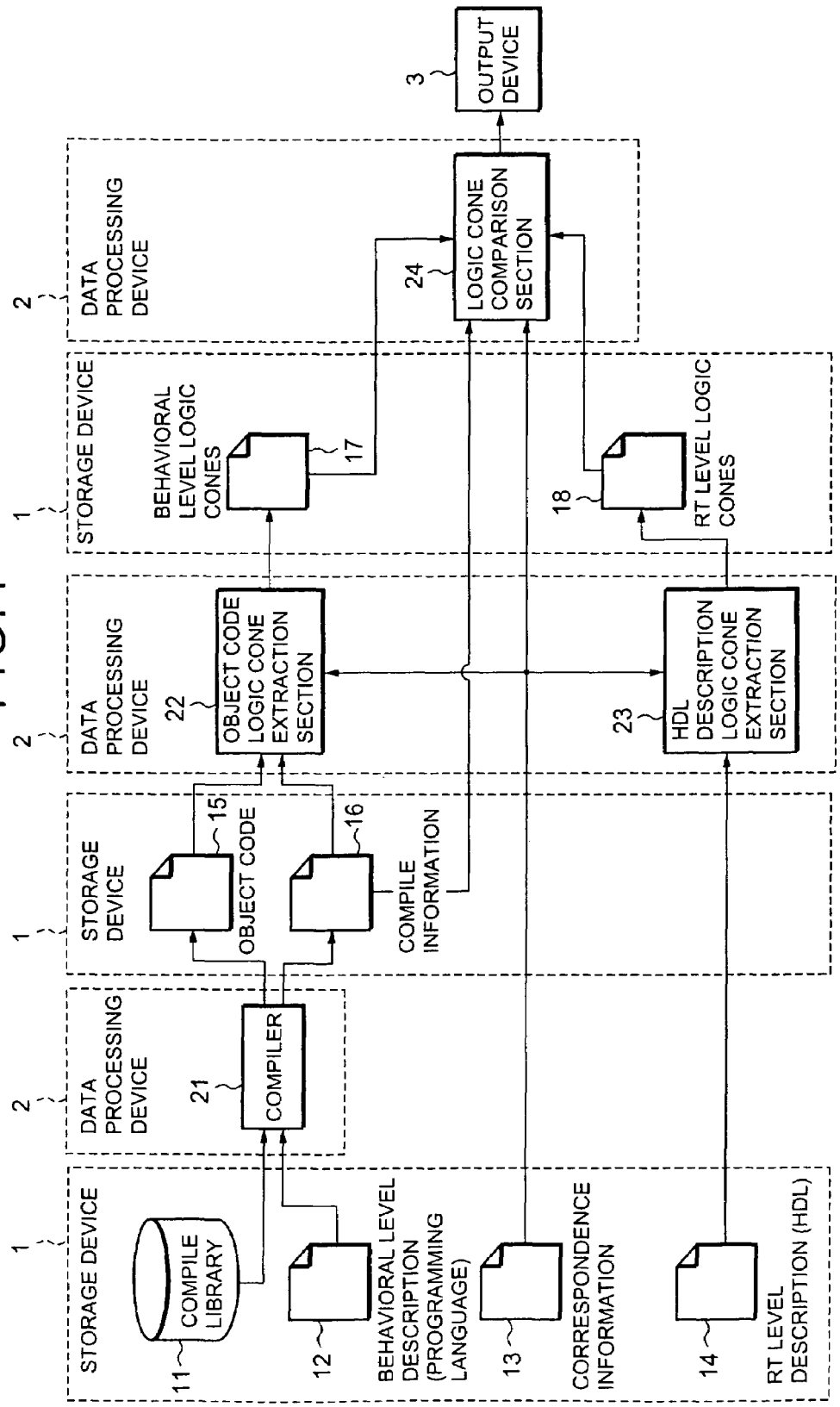
FIG. 4 is a block diagram showing the configuration of a first embodiment of the present invention.

Referring to FIG. 4, a logic verification system according to a first embodiment of the present invention includes a storage device 1 which stores information, a data processing device 2 which operates under programmed control and an output device 3 such as display device or printing device.

The data processing device 2 includes a compiler 21, object code logic cone extraction section 22, HDL description logic cone extraction section 23 and logic cone comparison section 24.

The storage device 1 stores in advance a compile library 11, a behavioral level description 12 represented in a programming language, correspondence information 13 and an RT level description 14 represented in HDL.

The behavioral level description 12 is generally manually written. C, C++, Java, SystemC and SpecC are used to write the behavioral level description 12. The compile library 11, required to compile the behavioral level description 12 into an object code and execute the object code on the CPU, may be, for example, a standard library of SystemC or other language, a library created by the designer or a library supplied from the compiler manufacturer. The RT level description 14 may be, for example, created by behavioral synthesis phase or obtained by giving the behavioral level description 12 to a behavioral synthesis system. Or, the RT level description 14 may be converted manually from the behavioral level description 12.

The correspondence information 13 is given by the behavioral synthesis system or the designer in behavioral synthesis phase when the behavioral level description 12 is converted into the RT level description 14. The correspondence information 13 contains information on pairs of fragments of descriptions to be compared and information on pairs of signals to be compared for each of the description pairs. Information on pairs of fragments of descriptions refers to information which identifies fragments (or whole) of the behavioral level description 12 and the converted fragments (or whole) of the RT level description 14. For example, if behavioral level description includes fragments executed in one cycle in succession, the correspondence information includes pairs of a behavioral fragment and a RT level fragment converted from the behavioral fragment in succession.

Figure 5:
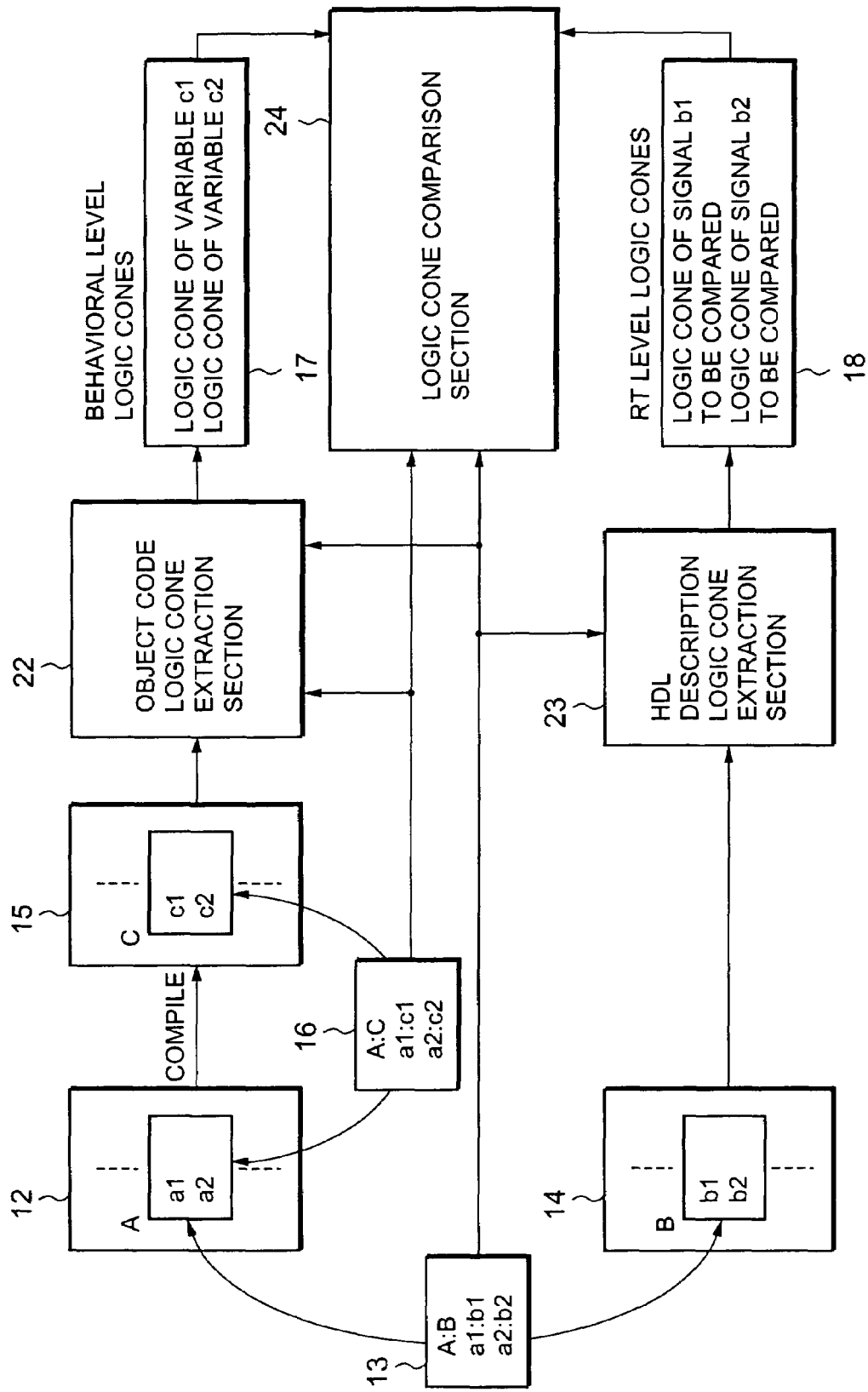
FIG. 5 is an explanatory diagram of operations of the first embodiment of the present invention.

A description of this point is given with reference. to FIG. 5. In the case where a certain fragment of description A included in the behavioral level description 12 and a fragment of description B of the RT level description 14 which corresponds to the fragment of description A are compared, an information (A:B)—pair of information which identifies the fragment of description A and information which identifies the fragment of description B—is set in the correspondence information 13. The fragment of description A has signals a1 and a2 while the fragment of description B signals b1 and b2, and when the pair of the a1 and the b1 and the pair of the a2 and the b2 are respectively compared, two pieces of information—information on correspondence between the signals a1 and b1 (a1:b1) and information on correspondence between the signals a2 and b2 (a2:b2)—are set in the correspondence information 13 in accordance with the description A-B pair information (A:B). To ensure accuracy in verification, it is preferable to comprehensively describe pairs of descriptions to be compared for equivalence and pairs of signals to be compared for equivalence for each of the description pairs in the correspondence information 13.

The compiler 21 generates a CPU-executable object code 15 and compile information 16 from the compile library 11 and the behavioral level description 12 and stores the object code 15 and the compile information 16 on the storage device. The compile information 16 is supplied, for example, in a standard format such as ELF (executable and linking format). The compile information 16 contains mapping information between the behavioral level description 12 and the object code 15. The mapping information indicates which fragments of the behavioral level description 12 corresponds to which fragments of the object code 15 and which signal in the behavioral level description 12 corresponds to which variable in the object code 15.

A description of this point is given with reference to FIG. 5. When the fragment of description A of the behavioral level description 12 corresponds to an object code portion C of the object code 15, the compile information 16 contains information (A:C) to the effect that the fragment of description A corresponds to the object code portion C. When the signals a1 and a2 of the fragment of description A are represented respectively by variables c1 and c2 in the object code 15, the compile information 16 indicates information (a1:c1) on correspondence between the signal a1 and the variable c1 and information (a2:c2) on correspondence between the signal a2 and the variable c2.

The object code logic cone extraction section 22 loads the object code 15 and the compile information 16 from the storage device 1 and extract a logic cone (behavioral level logic cone 17) for each of the variables corresponding to signals to be compared in each of the fragments of description specified by the correspondence information 13. The behavioral level logic cones 17 thus extracted are stored on the storage device 1.

A description of this point is given with reference to FIG. 5. The object code logic cone extraction section 22 recognizes the fragment of description A as one of the fragments of description to be compared and the signals a1 and a2 in the fragment of description A as signals to be compared by referencing the correspondence information 13 and also recognizes the object code portion C as a code portion corresponding to the fragment of description A and the variables c1 and c2 as variables corresponding to the signals a1 and a2 by referencing the compile information 16. Then, the object code logic cone extraction section 22 performs symbolic simulation of the object code portion C as described later, extracts a logic cone for the variable c1 and another for the variable c2 and stores the extracted logic cones on the storage device 1.

The HDL description logic cone extraction section 23 loads the RT level description 14 from the storage device 1 and extracts logic cones (RT level logic cones 18) of signals specified by the correspondence information 13 as signals to be compared. The RT level logic cones 18 thus extracted are stored on the storage device 1.

A description of this point is given with reference to FIG. 5. The HDL description logic cone extraction section 23 recognizes the fragment of description B as one of the fragments of description to be compared and the signals b1 and b2 in the fragment of description B as signals to be compared by referencing the correspondence information 13, extracts a logic cone of the signal b1 and another of the signal b2 from the RT level description 14 in the same manner as before and stores the logic cones on the storage device 1.

The logic cone comparison section 24 selects pairs of signals to be compared for each of the fragments of description to be compared which are specified by the correspondence information 13 stored on the storage device 1, respectively extracts the logic cones 17 and the logic cones 18 of the signals from the storage device 1 and judges whether the logic cones 17 and the logic cones 18 are logically equivalent. Then, the logic cone comparison section 24 outputs the judgment result from the output device 3.

A description of this point is given with reference to FIG. 5. The logic cone comparison section 24 recognizes the fragment of description A of the behavioral level description 12 and the fragment of description B of the RT level description 14 as a pair of fragments of description to be compared and also recognizes the signals a1 and b1 and the signals a2 and b2 respectively included in the pair of the fragment of descriptions A and B as pairs of signals to be compared by referencing the correspondence information 13. The logic cone comparison section 24 recognizes the fragment of description A of the behavioral level description 12 as a description corresponding to the object code portion C of the object code 15 and the signals a1 and a2 as signals corresponding to the variables c1 and c2. Then, the logic cone comparison section 24 extracts a logic cone of the variable c1 and another of the signal b1 from the storage device 1 and judges whether the logic cones are logically equivalent. The logic cone comparison section 24 also extracts a logic cone of the variable c2 and another of the signal b2 from the storage device 1 and judges whether the logic cones are logically equivalent.

Operations of the present embodiment will then be described in detail with reference to the drawings.

Figure 6:
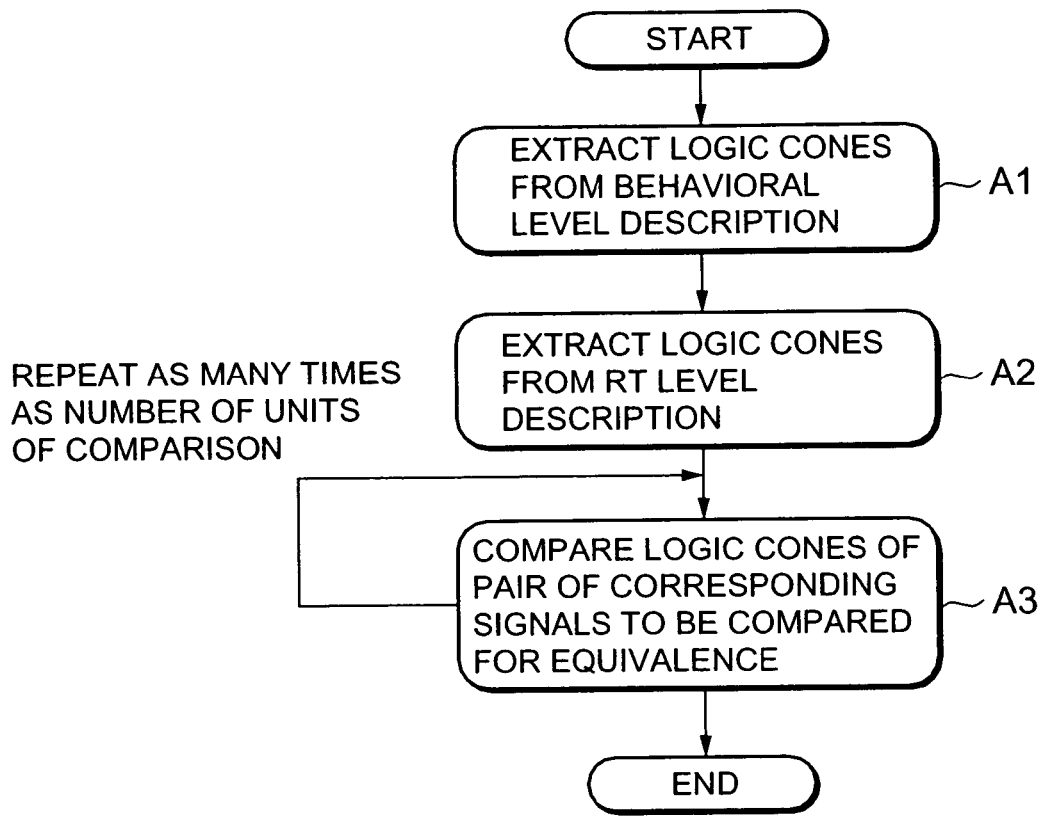
FIG. 6 is a flowchart showing operations of the first embodiment.

Referring to FIG. 6, in step A1, the logic cones 17 of signals to be compared are extracted from the object code 15 compiled from the behavioral level description 12. The step A1 will be described in detail later. In step A2, the logic cones 18 of signals to be compared are extracted from the RT level description 14. A pair of logic cones is extracted for each of the "pairs of signals to be compared" for each of the "pairs of fragments of description to be compared" which are specified by the correspondence information 13 and serves as a unit of comparison.

In step A3, a comparison of logical equivalence between corresponding signals to be compared is performed. Such steps are repeated as many times as the number of units of comparison. When all signals to be compared are found to be equivalent, a conclusion is reached that the object code 15 and the RT level description 14 are equivalent.

Figure 7:
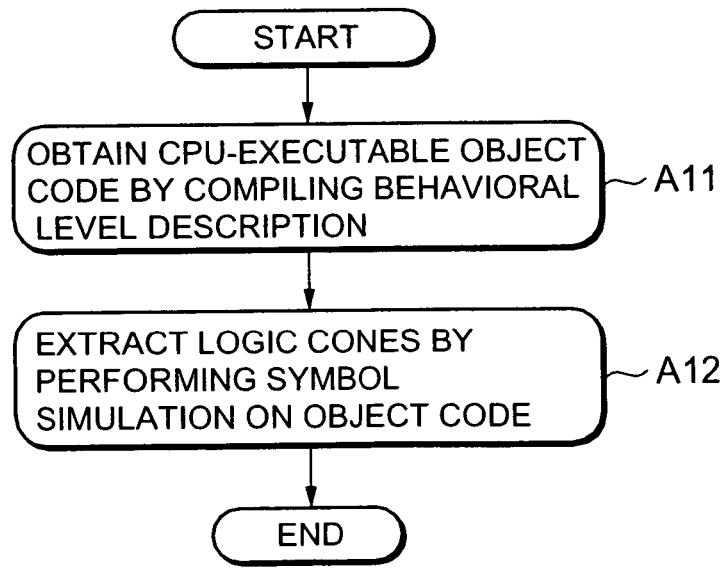
FIG. 7 is a flowchart showing operations of the first embodiment.

Referring to FIG. 7, the details of the step A1 are shown.

In step A11, the behavioral level description 12 is compiled into the CPU-executable object code 15 by the compiler 21. The step A11 may be omitted if the compiled object code 15 is already available.

In step A12, the logic cones 17 of signals to be compared are extracted by performing symbolic simulation of the compiled object code 15.

FIG. 8 shows the details of the step A12.

In step A121, the symbolic simulation start point is found on the object code 15. The symbolic simulation start point is determined by referencing the correspondence information 13 and the compile information 16. More specifically, fragment of the behavioral level description 12 is specified according to the "pairs of fragments of description to be compared" in the correspondence information 13. The compile information 16 indicates a start point on the object code 15 which corresponds to the start point of the fragment of description, and the indicated point serves as the symbolic simulation start point. A description of this point is given with reference to FIG. 5. The fragment of description A of the behavioral level description 12 is recognized as one of the fragments of descriptions to be compared based on the correspondence information 13. The fragment of description A is recognized as the description corresponding to the object code portion C based on the compile information 16. The start point of the object code portion C is used as the symbolic simulation start point. The symbolic simulation end point which will be described later is the end point of the object code portion C.

In step A122, initial symbol values are mapped to the signals to be compared. The signals to be compared are indicated by the correspondence information 13 and the compile information 16. Symbol value refers to a variable represented as a symbol rather than as an actual value such as integer. A description of this point is given with reference to FIG. 5. The signals a1 and a2 are recognized as being included in the fragment of the description A of the behavioral level description 12 based on the correspondence information 13. The signals a1 and a2 are recognized as the signals corresponding to the variables c1 and c2 in the object code portion C based on the compile information 16. The variables c1 and c2 are respectively treated as signals to be compared, and initial symbol values are mapped to the signals.

In step A123, symbolic simulation is performed one instruction at a time according to the definition of each of the instructions by tracing the object code 15 in orderly sequence starting with the symbolic simulation start point on the object code 15.

The object code 15 executed by the CPU is comprised of a combination of reading of values from storage elements such as memories and registers, operations performed on such values, writing of operation results to storage elements and changes to execution sequence such as conditional branching. When a symbol value is contained in a value used for operation, symbol value operation is performed. Symbol value operation refers to representation of operation result as an expression such as a function rather than actual operation, and this expression is also called a symbol value. In this case, when a value used for operation contains an immediate value, the immediate value is converted into its symbol value first before symbol value operation is performed. The symbol value representing the operation result from symbol value operation is stored on a specified storage element. When a branching condition for conditional branching is a symbol value, the branching condition symbol value is stored and tracing continues for both cases, namely, with and without branching. When the branching condition is an immediate value, code tracing continues for only one of the cases depending on branching operation result. Tracing of the object code 15 continues until the symbolic simulation end point on the object code 15 is reached.

A symbol value is obtained in relation to the signal to be compared when the symbolic simulation end point is reached. The symbol value is more specifically a symbol value which represents the value of the signal to be compared, obtained as a result of symbolic simulation of the object code 15 from the start to end points, with expression under initial symbol values of the signals to be compared which is set when symbolic simulation starts. The symbol value is comprised of an initial symbol value and a symbol value operation and changes into a combinational logic formula when the initial symbol value and the symbol value operation are converted respectively into a circuit input variable and logic operation. A logic formula thus obtained is used as a logic cone (step A125).

If there are several paths for reaching the symbolic simulation end point as a result of branching, a logic formula is prepared for two values; a branching condition symbol value stored in advance and a symbol value obtained when the symbolic simulation end point is reached, thus combining these values into a single symbol value by a multiplexer. Then, the symbol value is similarly converted into a logic formula and used as a logic cone.

When the correspondence information 13 contains several fragments of description to be compared in relation to the behavioral level description 12, processings shown in FIG. 8 are performed for each of the fragments of description.

EXAMPLES

Operations of the first embodiment will then be described using specific examples.

Referring to FIG. 9, an example of the behavioral level description 12 written in programming language C is shown. This description designates that a function by the name of addition( ) is synthesized into a circuit by behavioral synthesis (line 11). The function addition( ) is described using variables a and b such that, each time the function is called, the cumulative sum of a variable in0 is stored in a variable out0 (lines 12 to 18).

Referring to FIG. 10, an example of the RT level description 14 converted from the behavioral level description 12 of FIG. 9 is shown. The function addition( ) in the behavioral level description 12 is implemented as a module by the name of addition (lines 1 to 13). The variable in0 is implemented as an input to the module (line 2). The variable out0 is implemented as an output from the module (line 3). Operations of the function are implemented using two registers RG01 and RG02 (lines 10 and 11).

Referring to FIG. 12, an example of part of the correspondence information 13 is shown. The correspondence information 13 gives a correspondence relation between the variables in0, out0, a and b in the behavioral level description 12 and signals in0, out0, RG01 and RG02 in the RT level description 14. Separately the correspondence information 13 gives information to the effect that the function addition( ) has been synthesized through behavioral synthesis and that the function addition( ) has been implemented as the module by the name of addition.

It is assumed that the behavioral level description 12 in FIG. 9, the RT level description 14 in FIG. 10 and the correspondence information 13 are given.

The behavioral level description 12 is converted into the CPU-executable object code 15 by the compiler 21 (step A11 of FIG. 7).

Referring to FIG. 11, which shows an example of part of the object code 15, movl and addl respectively represent instructions executed by the CPU. The movl is an instruction designed to load the value from a specified address (first argument) in the memory space into a specified register (second argument). The addl is an instruction which adds the value in a specified register (first argument) and the value stored in a specified address (second argument) in the memory space and stores the sum in the specified register (first argument) in0, a, b and out0 are labels representing addresses in the memory space. % eax represents a register provided in the CPU.

Operations of the function addition( ) are implemented by a series of instructions starting with the label by the name of addition. Lines 2 and 3 allow the values of the variables a and b to be added and the sum to be stored in the variable b. Lines 4 and 5 allow the value of the variable in0 to be stored in the variable a. Lines 6 and 7 allow the value of the variable b to be copied to the variable out0.

Referring to FIG. 13, an example of part of the compile information 16 is shown. The compile information 16 indicates that the variables in0, out0, a and b in the behavioral level description 12 are stored in similarly labeled addresses in the memory space in the object code 15. Further, the compile information 16 separately indicates that the processings of the function addition( ) correspond to those of the object code illustrated in FIG. 11.

Next, the logic cones 17 are extracted from the object code 15 in FIG. 11 (step A12 of FIG. 7). To extract the logic cones 17, the symbolic simulation start point is found first on the object code 15. The symbolic simulation start point is specified by the correspondence information 13 and the compile information 16. In the case of the object code illustrated in FIG. 11, the instruction following the label "addition" serves as the symbolic simulation start point.

Next, initial symbol values are set in the variables to be subjected to symbolic simulation. In the case of the object code 15 illustrated in FIG. 11, the variables a, b, in0 and out0, which are specified by the correspondence information 13 and the compile information 16, are subjected to symbolic simulation.

Figure 14:
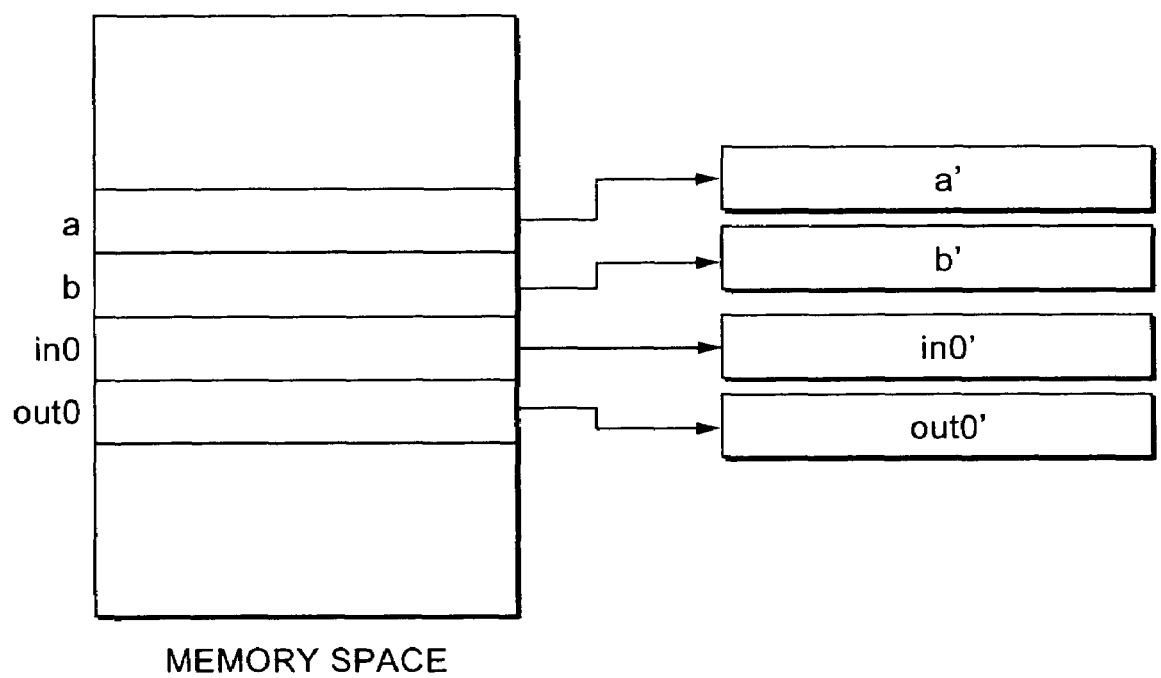
FIG. 14 illustrates a specific example of operations of the first embodiment.

Referring to FIG. 14, an example of initial symbol value settings is shown. Initial symbol values a', b', in0' and out0' are mapped to addresses in the memory space corresponding to the variables a, b, in0 and out0, respectively. In the example, a dash is added after each of the variables to represent the symbol values of the variables before simulation.

Symbolic simulation progresses as the object code 15 is traced in sequence (step A123 of FIG. 8).

Figure 15:
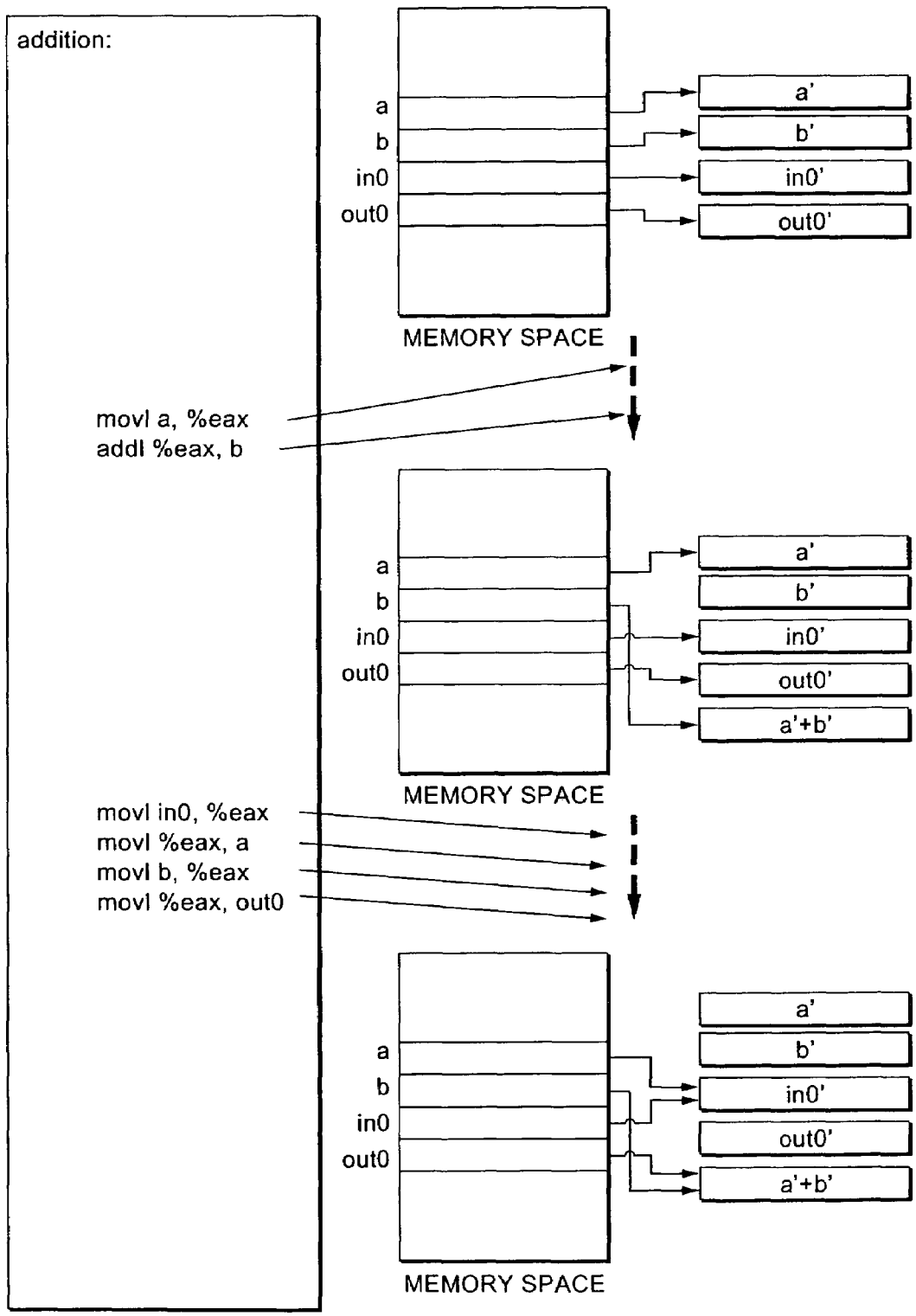
FIG. 15 illustrates a specific example of operations of the first embodiment.

FIG. 15 shows an example of how symbolic simulation is performed. After two instructions have been executed from the start point, the symbol value representing the value of the variable b changes into a symbol value "a'+b'" which represents the sum of the variables a and b. FIG. 15 also shows that, at the symbolic simulation end point, the value of the variable a has changed into the symbol value in0' which represents the value of the variable in0 and that the values of the variables b and out0 have changed into the symbol value "a'+b'" which represents the sum of the variables a and b. These symbol values are used as logic cones (step A125 of FIG. 8). FIG. 16 illustrates examples of extracted logic cones.

The logic cones 18 are extracted next from the RT level description 14 (step A2 of FIG. 6). FIG. 17 illustrates examples of the logic cones 18 extracted from the RT level description 14.

Finally, equivalence is examined between the logic cones 17 and the logic cones 18 of corresponding signal pairs (step A3 of FIG. 6). By referring to FIGS. 12 and 13, corresponding signal pairs are shown in FIG. 10. When the logic cones 17 and the logic cones 18 are equivalent for all pairs, a conclusion is reached that the object code 15 and the RT level description 14 are equivalent.

Second Embodiment

A second embodiment of the present invention will then be described in detail with reference to the drawings.

The second embodiment of the present invention differs from the first embodiment in that the RT level description is given in a programming language rather than in HDL.

Figure 19:
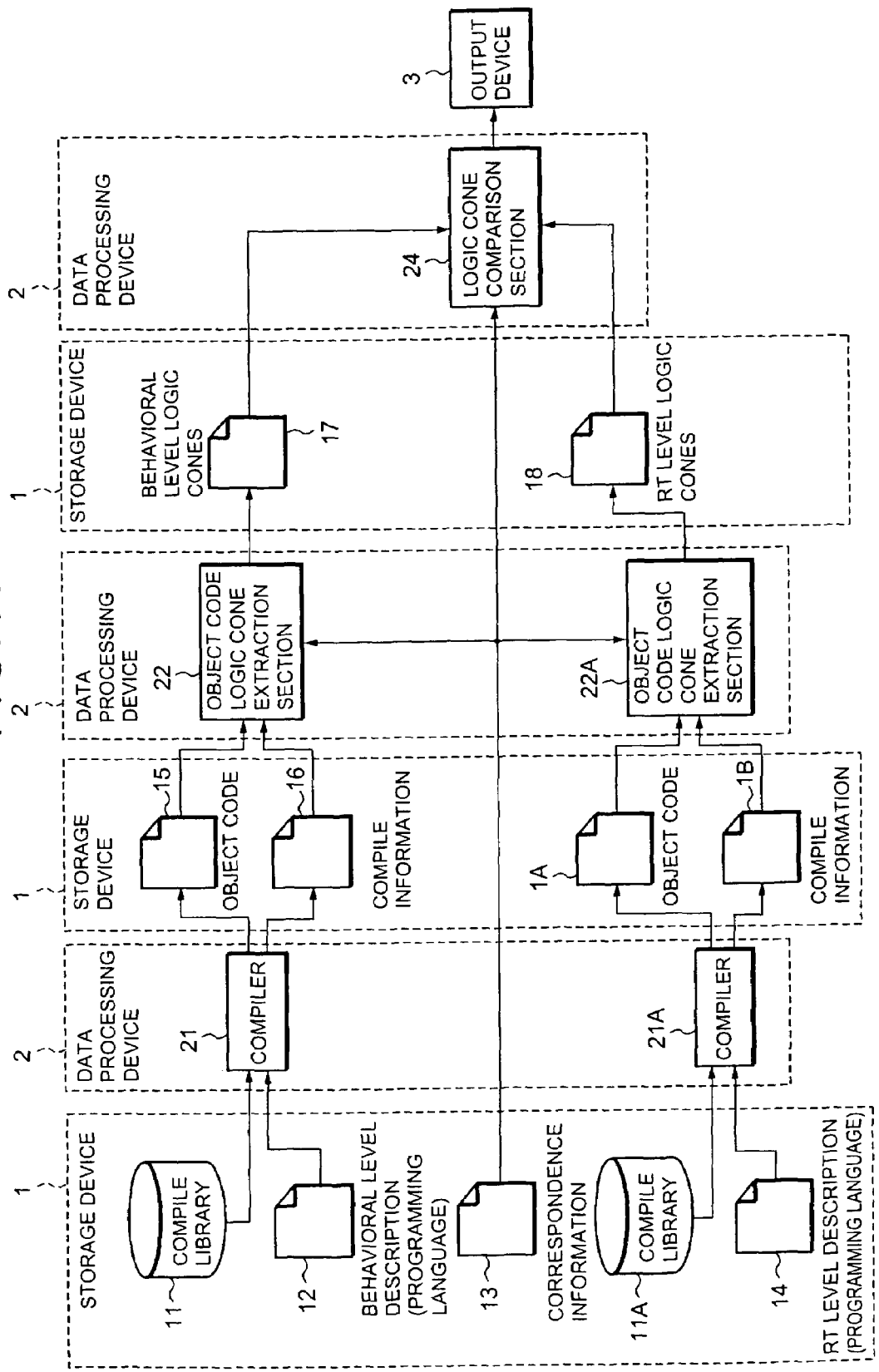
FIG. 19 is a block diagram of the configuration of a second embodiment of the present invention.

Referring to FIG. 19, the second embodiment of the present invention differs from the first embodiment in that the second embodiment handles extraction of the RT level logic cones 18 from the RT level description 14 by a compiler 21A and an object code logic cone extraction section 22A rather than the HDL description logic cone extraction section 23 as shown in FIG. 4.

The compiler 21A generates a CPU-executable object code 1A and compile information 1B from the compile library 11A and the RT level description 14 given in a programming language and stores the CPU-executable object code 1A and the compile information 1B on the storage device 1. The compile information 1B describes a correspondence relation in respect of variables and program storage locations between the RT level description 14 and the object code 1A.

The object code logic cone extraction section 22A loads the object code 1A from the storage device 1 and extracts logic cones (RT level logic cones 18) of variables contained in the descriptions to be compared for each of such fragments of description by referencing the correspondence information 13 and the compile information 1B. Operations of the object code logic cone extraction section 22A are basically the same as those of the object code logic cone extraction section 22.

In the second embodiment, similarly to the first embodiment, the logic cone comparison section 24 compares the operation level logic cones 17 and the RT level logic cones 18 for equivalence.

Advantages of the second embodiment will be described hereinbelow.

Use of a programming language for the RT level description allows simulation using a rich collection of libraries available in the programming language used. In this case, demands are growing for behavioral synthesis systems producing an RT level description output in a programming language rather than in HDL. The present embodiment is capable of verifying equivalence between two given descriptions even if the RT level description is given in a programming language rather than in HDL.

Third Embodiment

A third embodiment of the present invention will then be described in detail with reference to the drawings.

The third embodiment of the present invention differs from the first embodiment in that the third embodiment proves whether given properties are met by a given program description rather than verifying equivalence between two given descriptions.

Figure 20:
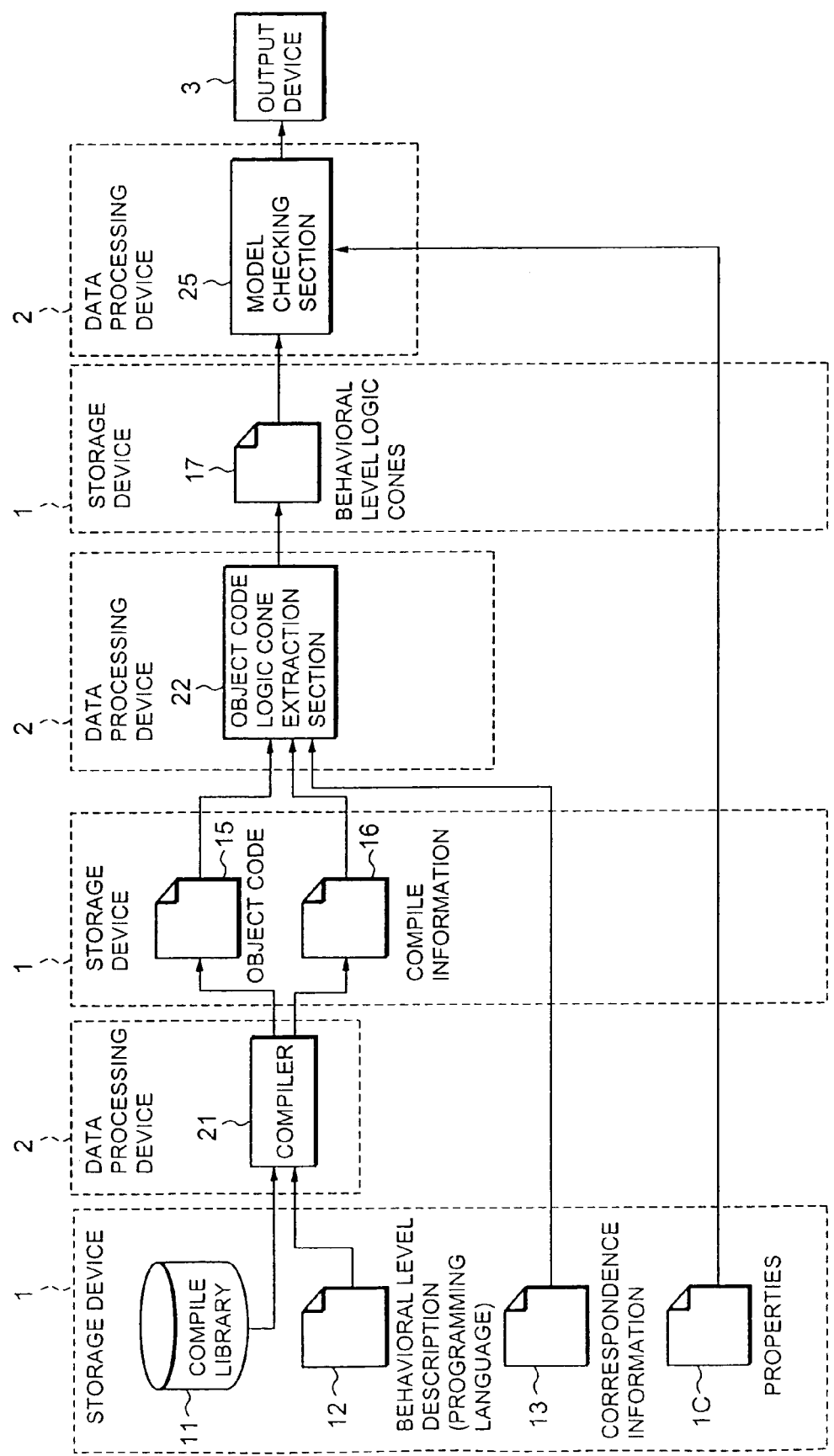
FIG. 20 is a block diagram of the configuration of a third embodiment of the present invention.

Referring to FIG. 20, the third embodiment of the present invention differs from the first embodiment in that the third embodiment comprises the model checking section 25 and performs formal property verification rather than formal equivalence verification.

In the third embodiment, similarly to the first embodiment, the compiler 21 and the object code logic cone extraction section 22 are also provided and the behavioral level logic cones 17 are extracted from the behavioral level description 12, the compile library 11 and the correspondence information 13.

The model checking section 25 is provided with the behavioral level logic cones 17 and properties 1C and enumerates sets of possible combinations of signals of the circuit (called states). When all sets of states are enumerated, the model checking section 25 checks whether these sets meet the given properties.

Referring to FIG. 21, operations of the third embodiment of the present invention are shown.

In step A31, the behavioral level description 12 written in a programming language is compiled into the CPU-executable object code 15 by the compiler 21.

In step A32, the logic cones 17 are extracted from the compiled object code 15.

In step A33, the model checking section 25 judges whether the behavioral level description 12 meets the given properties and outputs the judgment result to the output device 3. An existing technique such as those mentioned earlier can be used for the model checking section 25.

Advantages of the present embodiment will be described hereinbelow. The third embodiment is capable of verifying whether the behavioral level description 12 meets the given properties 1C even if the given properties 1C are those which must be met by the behavioral level description 12 written in a programming language rather than those to be met by the RT level description.

While the embodiments and examples of the present invention have been set forth hereinabove, the present invention is not limited to such embodiments and examples, but various additions and modifications could be made without departing from the scope and spirit of the present invention. The functionality of the logic verification system and the logic cone extraction apparatus of the present invention can be implemented not only in hardware but also by a computer, logic verification program and logic cone extraction program. The logic verification program and the logic cone extraction program are supplied pre-recorded on a computer-readable medium such as magnetic disk or semiconductor memory, loaded into the computer, for example, when the computer starts up and allows the computer to function as the logic verification system and the logic cone extraction apparatus in the foregoing embodiments by controlling the computer operations.

As set forth hereinabove, according to the present invention, equivalence can be verified between an RT level description and an object code compiled from an behavioral level description written in a programming language. This allows logic verification to ensure equivalence between an execution result of the behavioral level description by the CPU and an execution result of operations of the circuit obtained from behavioral synthesis.

Further, according to the present invention, formal property can be verified of an object code compiled from an behavioral level description written in a program description language.

Furthermore, according to the present invention, logic cones can be automatically extracted from an object code compiled from a program description for each of the variables in the object code corresponding to signals to be extracted which are specified by correspondence information and for each of the logic cone extraction areas specified by the correspondence information, based on the correspondence information and the compile information.

What is claimed is:

1. A logic verification system comprising:
    a storage section for storing an object code compiled from an behavioral level description written in a programming language, the object code being used for specification verification by simulation on a CPU in a design phase,
    an RT level description generated from the behavioral level description,
    correspondence information which specifies information on pairs of fragments of descriptions to be compared which are included in the behavioral level description and the RT level description and which specifies information on pairs of signals to be compared for each description pair, and
    compile information which includes mapping information which specifies information on a pair of a description fragment of the behavioral level description and a code portion of the object code and which specifies information on a pair of a signal in the behavioral level description and a variable in the object code;
    a first logic cone extraction section configured to extract first logic cones of variables by:
        searching a code portion and the variables of the object code corresponding to each fragments of descriptions and each signals of behavioral level description to be compared which are specified by the correspondence information by referencing the compile information,
        setting initial symbol values in the variables,
        performing symbolic simulation from the start to end points of the code portion to produce symbol values when the variable symbolic simulation ends, and
        using the symbol values as the first logic cones of the variables;
    a second logic cone extraction section configured to extract second logic cones each for the signals for each fragments of description of RT level description to be compared which are specified by the correspondence information;
    a logic cone comparison section configured to select a corresponding logic cone, as a first logic cone, from among the logic cones extracted by the first logic cone extraction section by referencing the compile information, to select a corresponding logic cone, as a second logic cone, from among the logic cones extracted by the second logic cone extraction section by referencing the correspondence information, and to compare the first logic cone and the second logic cone, for each signal and description fragment to be compared in the behavioral level description and the RT level description which are specified by the correspondence information; and
    means for determining, based on the comparison of the first logic cones and the second logic cones, whether the RT level description that has been designed in a behavioral synthesis phase is acceptable to be used in a manufacturing phase for the logic circuits,
    wherein the RT level description that has been designed in the behavioral synthesis phase is determined to be acceptable to be used in a manufacturing phase for the logic circuits when the first logic cones are logically equivalent to the second logic cones.

2. A logic verification method comprising the steps of:
    inputting an object code compiled from an behavioral level description written in a programming language, an RT level description generated from the behavioral level description, correspondence information which specifies information on pairs of fragments of descriptions to be compared which are included in the behavioral level description and the RT level description and which specifies information on pairs of signals to be compared for each description pair, and compile information which includes mapping information which specifies information on a pair of a description fragment of the behavioral level description and a code portion of the object code and which specifies information on a pair of a signal in the behavioral level description and a variable in the object code, the object code being used for specification verification by simulation on a CPU in a design phase;

searching a code portion and the variables of the object code corresponding to each fragments of description and each signals of behavioral level description to be compared which are specified by the correspondence information by referencing the compile information;

setting initial symbol values in the variables;

performing symbolic simulation from the start to end points of the code portion;

determining first logic cones of the variables as symbol values when the variable symbolic simulation ends;

extracting second logic cones each for the signals for each fragments of RT level description to be compared which are specified by the correspondence information;

selecting corresponding logic cones, as first selected logic cones, from among the logic cones determined in the determining step by referencing the compile information;

selecting corresponding logic cones, as second selected logic cones, from among the logic cones extracted in the extracting step by referencing the correspondence information;

comparing the first selected logic cones and the second selected logic cones for each of the signals and for each of the descriptions to be compared in the behavioral level description and the RT level description which are specified by the correspondence information;

determining, based on the comparing step, whether the RT level description that has been designed in a behavioral synthesis phase is acceptable to be used in a manufacturing phase for the logic circuits; and if the RT level description is determined to be acceptable, manufacturing the logic circuits based on the RT level description, wherein the RT level description that has been designed in the behavioral synthesis phase is determined to be acceptable to be used in a manufacturing phase for the logic circuits when the first selected logic cones are logically equivalent to the second selected logic cones.

3. A computer-readable medium embodying a computer program product and comprising code that, when executed, causes a computer to perform logic verification, the program product comprising the steps of:

a) storing an object code compiled from an behavioral level description written in a programming language, the object code being used for specification verification by simulation on a CPU in a design phase, an RT level description generated from the behavioral level description, correspondence information which specifies information on pairs of fragments of descriptions to be compared which are included in the behavioral level description and the RT level description and which specifies information on pairs of signals to be compared for each description pair, and compile information which includes mapping information which specifies information on a pair of a description fragment of the behavioral level description and a code portion of the object code and which specifies information on a pair of a signal in the behavioral level description and a variable in the object code;

b) extracting first logic cones from a machine-executable object code compiled from a behavioral level description written in a programming language;

c) extracting second logic cones from an RT level description;

d) selecting corresponding logic cones, as first selected logic cones, from among the logic cones determined in the step b) by referencing the compile information;

e) selecting corresponding logic cones, as second selected logic cones, from among the logic cones extracted in the step c) by referencing the correspondence information;

f) comparing the first selected logic cones and the second selected logic cones to verify equivalence between the first and second selected logic cones; and g) determining, based on the comparison of the first selected logic cones and the second selected logic cones, whether the RT level description that has been designed in a behavioral synthesis phase is acceptable in a manufacturing phase for the logic circuits; and h) if the RT level description is determined to be acceptable, manufacturing the logic circuits based on the RT level description, wherein the RT level description that has been designed in the behavioral synthesis phase is determined to be acceptable to be used in a manufacturing phase for the logic circuits when the first selected logic cones are logically equivalent to the second selected logic cones, wherein the step b) comprises the steps of:

b.1) searching a code portion and the variables of the object code corresponding to each fragments of description and each signals of behavioral level description to be compared which are specified by the correspondence information by referencing the compile information;

b.2) setting initial symbol values in the variables;

b.3) performing symbolic simulation from the start to end points of the code portion; and b.4) determining the first logic cones of the variables as symbol values when the variable symbolic simulation ends.

4. A logic verification system comprising:

a storage section configured to store a behavioral level description written in a programming language, an RT level description generated from the behavioral level description, correspondence information which specifies information on pairs of fragments of descriptions to be compared which are included in the behavioral level description and the RT level description and which specifies information on pairs of signals to be compared for each description pair, and a compiler section configured to output an object code, which is compiled from the behavioral level description and is executable by a CPU, and compile information including mapping information which specifies information on a pair of a description fragment of the behavioral level description and a code portion of the object code and which specifies information on a pair of a signal in the behavioral level description and a variable in the object code;

a first logic cone extraction section configured to extract first logic cones of variables by:

searching a code portion and the variables of the object code corresponding to each fragments of descriptions and each signals of behavioral level description to be compared which are specified by the correspondence information by referencing the compile information, setting initial symbol values in the variables, performing symbolic simulation from the start to end points of the code portion to produce symbol values when the variable symbolic simulation ends, and using the symbol values as the first logic cones of the variables;

a second logic cone extraction section configured to extract second logic cones each for the signals for each fragments of description of RT level description to be compared which are specified by the correspondence information;

a logic cone comparison section configured to select a corresponding logic cone, as a first logic cone, from among the logic cones extracted by the first logic cone extraction section by referencing the compile information, to select a corresponding logic cone, as a second logic cone, from among the logic cones extracted by the second logic cone extraction section by referencing the correspondence information, and to compare the first logic cone and the second logic cone, for each signal and description fragment to be compared in the behavioral level description and the RT level description which are specified by the correspondence information; and means for determining, based on the comparison of the first logic cones and the second logic cones, whether the RT level description that has been designed in a behavioral synthesis phase is acceptable to be used in a manufacturing phase for the logic circuits, wherein the RT level description that has been designed in the behavioral synthesis phase is determined to be acceptable to be used in a manufacturing phase for the logic circuits when the first logic cones are logically equivalent to the second logic cones.

5. A logic verification method comprising the steps of:

inputting a behavioral level description written in a programming language, an RT level description generated from the behavioral level description, correspondence information which specifies information on pairs of fragments of descriptions to be compared which are included in the behavioral level description and the RT level description and which specifies information on pairs of signals to be compared for each description pair;

compiling the behavioral level description into an object code and compile information, wherein the object code is executable by the CPU, wherein the compile information includes mapping information which specifies information on a pair of a description fragment of the behavioral level description and a code portion of the object code and which specifies information on a pair of a signal in the behavioral level description and a variable in the object code;

searching a code portion and the variables of the object code corresponding to each fragments of description and each signals of behavioral level description to be compared which are specified by the correspondence information by referencing the compile information;

setting initial symbol values in the variables;

performing symbolic simulation from the start to end points of the code portion;

determining first logic cones of the variables as symbol values when the variable symbolic simulation ends;

extracting second logic cones each for the signals for each fragments of RT level description to be compared which are specified by the correspondence information;

selecting corresponding logic cones, as first selected logic cones, from among the logic cones determined in the determining step by referencing the compile information;

selecting corresponding logic cones, as second selected logic cones, from among the logic cones extracted in the extracting step by referencing the correspondence information;

comparing the first selected logic cones and the second selected logic cones, for each signal and description fragment to be compared in the behavioral level description specified by the correspondence information;

determining, based on the comparing step, whether the RT level description that has been designed in a behavioral synthesis phase is acceptable to be used in a manufacturing phase for the logic circuits; and if the RT level description is determined to be acceptable, manufacturing the logic circuits based on the RT level description, wherein the RT level description that has been designed in the behavioral synthesis phase is determined to be acceptable to be used in a manufacturing phase for the logic circuits when the first selected logic cones are logically equivalent to the second selected logic cones.

6. computer-readable medium embodying a computer program product and comprising code that, when executed, causes a computer to perform logic verification, the program product comprising the steps of:

a) storing a behavioral level description written in a programming language, an RT level description generated from the behavioral level description, correspondence information which specifies information on pairs of fragments of descriptions to be compared which are included in the behavioral level description and the RT level description and which specifies information on pairs of signals to be compared for each description pair;

b) compiling the behavioral level description into an object code and compile information, wherein the object code is executable by the CPU, wherein the compile information includes mapping information which specifies information on a pair of a description fragment of the behavioral level description and a code portion of the object code and which specifies information on a pair of a signal in the behavioral level description and a variable in the object code;

c) extracting first logic cones from a machine-executable object code compiled from a behavioral level description written in a programming language;

d) extracting second logic cones from an RT level description;

e) selecting corresponding logic cones, as first selected logic cones, from among the logic cones determined in the step b) by referencing the compile information;

f) selecting corresponding logic cones, as second selected logic cones, from among the logic cones extracted in the step c) by referencing the correspondence information;

g) comparing the first selected logic cones and the second selected logic cones, for each signal and description fragment to be compared in the behavioral level description specified by the correspondence information; and h) determining, based on the comparison of the first selected logic cones and the second selected logic cones, whether the RT level description that has been designed in a behavioral synthesis phase is acceptable in a manufacturing phase for the logic circuits; and
i) if the RT level description is determined to be acceptable, manufacturing the logic circuits based on the RT level description,
wherein the RT level description that has been designed in the behavioral synthesis phase is determined to be acceptable to be used in a manufacturing phase for the logic circuits when the first selected logic cones are logically equivalent to the second selected logic cones,
wherein the step c) comprises the steps of:

c.1) searching a code portion and the variables of the object code corresponding to each fragments of description and each signals of behavioral level description to be compared which are specified by the correspondence information by referencing the compile information;
c.2) setting initial symbol values in the variables;
c.3) performing symbolic simulation from the start to end points of the code portion;
and
c.4) determining the first logic cones of the variables as symbol values when the variable symbolic simulation ends.

* * * * *